United States Patent
Kudou et al.

(10) Patent No.: US 7,842,979 B2
(45) Date of Patent: Nov. 30, 2010

(54) SOLID-STATE IMAGING DEVICE AND METHOD OF DRIVING THE SAME

(75) Inventors: Hiroyoshi Kudou, Kanagawa (JP); Satoshi Uchiya, Kanagawa (JP); Junichi Yamamoto, Kanagawa (JP); Fumiaki Futamura, Kanagawa (JP)

(73) Assignee: NEC Electronics Corporation, Kanagawa (KP)

(*) Notice: Subject to any disclaimer, the term of this patent is extended or adjusted under 35 U.S.C. 154(b) by 96 days.

(21) Appl. No.: 12/392,195

(22) Filed: Feb. 25, 2009

(65) Prior Publication Data

US 2009/0206372 A1    Aug. 20, 2009

Related U.S. Application Data

(63) Continuation of application No. 11/518,907, filed on Sep. 12, 2006, now Pat. No. 7,514,729.

(30) Foreign Application Priority Data

Sep. 29, 2005    (JP) .............................. 2005-284902

(51) Int. Cl.
*H01L 29/80* (2006.01)
(52) U.S. Cl. ................. 257/222; 257/219; 257/E31.108
(58) Field of Classification Search ......... 257/222–231; 438/60, 75–79

See application file for complete search history.

(56) References Cited

U.S. PATENT DOCUMENTS 7,187,411 B2    3/2007    Yamada

FOREIGN PATENT DOCUMENTS

| CN | 1194469 | 9/1998 |
| JP | 02-050480 | 2/1990 |
| JP | 06-236987 | 8/1994 |
| JP | 10-189937 | 7/1998 |

*Primary Examiner*—Keneth A Parker
*Assistant Examiner*—Paul E Patton
(74) *Attorney, Agent, or Firm*—Young & Thompson

(57) ABSTRACT

A solid-state imaging device includes an N-type semiconductor substrate, an N-type impurity region provided in the surficial portion of the N-type semiconductor substrate, a photo-electric conversion unit formed in the N-type impurity region, a charge accumulation unit formed in the N-type impurity region so as to contact with the photo-electric conversion unit, and temporarily accumulating charge generated in the photo-electric conversion unit, a charge hold region (barrier unit) formed in the N-type impurity region so as to contact with the charge accumulation unit, and allowing the charge accumulation unit to accumulate the charge, and a charge accumulating electrode provided to the charge accumulation unit. The charge accumulation unit and the charge hold region are formed to be $N^-$-type.

16 Claims, 7 Drawing Sheets

SOLID-STATE IMAGING DEVICE AND METHOD OF DRIVING THE SAME

This application is based on Japanese patent application No. 2005-284902 the content of which is incorporated hereinto by reference.

BACKGROUND

1. Technical Field

The present invention relates to a solid-state imaging device and a method of driving the same.

2. Related Art

Japanese Laid-Open Patent Publication No. H2-50480 discloses a solid-state imaging device which includes a photo-electric conversion unit formed in a semiconductor substrate and generating signal charge corresponding to incident light; a charge accumulation unit provided in the semiconductor substrate as being adjacent to the photo-electric conversion unit, and temporarily accumulating the signal charge; a transfer gate unit receiving the signal charge from the charge accumulation unit, and transferring it; and a CCD.

FIG. 6 shows a sectional view of the solid-state imaging device disclosed in Japanese laid-open patent publication No. H2-50480. In this configuration, an N-type region 12 is commonly formed over a region ranging from the photo-electric conversion unit, the charge accumulation unit 17, the transfer gate unit 18 and the CCD. In the surficial portion of the charge accumulation unit 17 in the substrate, a $P^+$-type region 14 is formed as being connected to a surface $P^+$-type region 4 of the photo-electric conversion unit, so as to form a p-n junction at a level shallower than the $P^+$-type region 4 forms. Also a $P^-$-type region 15 is formed in the surficial portion of the substrate under a transfer gate 8. Because the N-type region is formed thicker in the charge accumulation unit 17 than in the photo-electric conversion unit as shown in the drawing, the charge accumulation unit 17 has a deeper potential well.

FIG. 7 shows a sectional view of a solid-state imaging device disclosed in Japanese Laid-Open Patent Publication No. H6-236987.

The solid-state imaging device includes an impurity-diffused region 1002 (photo-electric conversion unit) converting the incident light into signal charge, and accumulating it; a readout region 1007 into which the signal charge accumulated in the impurity-diffused region 1002 is read out; and a charge readout gate 1008 controlling readout of the signal charge accumulated in the impurity-diffused region 1002 into the readout region 1007. Between the impurity-diffused region 1002 and the charge readout gate 1008, there is formed a high-concentration impurity-diffused region 1009 having a potential set lower than that of the impurity-diffused region 1002, and allowing, in an accumulation period, the signal charge to flow thereinto from the impurity-diffused region 1002 to be accumulated therein. An accumulation gate electrode 1011 is formed on the high-concentration impurity-diffused region 1009. The high-concentration impurity-diffused region 1009 has a different conductivity-type from that of the charge readout gate 1008.

In thus-configured solid-state imaging device, the signal charge is readout as described below. First, in the accumulation period of the signal charge, the accumulation gate electrode 1011 and the readout gate electrode 1003 are brought down to the low level. The signal charge herein is accumulated in the high-concentration impurity-diffused region 1009. When only the readout gate electrode 1003 is brought up to the high level, the signal charge accumulated in the high-concentration impurity-diffused region 1009 is allowed to flow into the charge readout gate 1008. If a negative voltage is then applied to the accumulation gate electrode 1011, the signal charge accumulated in the high-concentration impurity-diffused region 1009 is allowed to rapidly flow into the charge readout gate 1008.

The prior arts described in the above have, however, suffered from problems in the aspects below.

The solid-state imaging device described in Japanese Laid-Open Patent Publication No. H6-236987 has the charge readout gate 1008 composed of the surficial portion of the semiconductor substrate 1001 which falls between the high-concentration impurity-diffused region 1009 and the readout region 1007. In this configuration, the charge accumulated in the high-concentration impurity-diffused region 1009 is read out into the readout region 1007, as being transferred through a channel formed in the surficial portion of the semiconductor substrate. Therefore in the process of reading the charge accumulated in the high-concentration impurity-diffused region 1009 out into the readout region 1007, the charge readout gate 1008 can never have a deep potential unless the readout gate electrode 1003 is applied with a high voltage. In particular, the potential at the interface between the high-concentration impurity-diffused region 1009 and the charge readout gate 1008 will remain at a high level, and will degrade the transfer efficiency.

Similarly, the solid-state imaging device described in Japanese Laid-open patent publication No. H2-50480 has the transfer gate unit 18 composed of the $P^-$-type region 15 having a conductivity type different from that (N-type) of the photo-electric conversion unit and the charge accumulation unit. Also in this configuration, it is therefore necessary, in readout of the charge from the charge accumulation unit 17, to apply a high voltage to the transfer gate 8.

SUMMARY OF THE INVENTION

According to the present invention, there is provided a solid-state imaging device (or a solid-state image pickup device) including:

a semiconductor substrate;

a first-conductivity-type impurity region provided in the surficial portion of the semiconductor substrate;

a photo-electric conversion unit formed in the impurity region;

a charge accumulation unit formed in the impurity region so as to contact with the photo-electric conversion unit, and temporarily accumulating charge generated in the photo-electric conversion unit, the charge accumulation unit having the first conductivity;

a barrier unit formed in the impurity region so as to contact with the charge accumulation unit, and having the charge accumulation unit accumulate the charge, the barrier unit having the first conductivity; and a first electrode provided to the charge accumulation unit.

Here, the surficial portion of the semiconductor substrate may have the first conductivity type, over a region having the charge accumulation unit and the barrier unit formed therein.

In this configuration, the charge generated in the photo-electric conversion unit is transferred through the buried channel, which is a region of the same conductivity type, so that the accumulation and transfer of the charge can be controlled only by a low voltage.

The solid-state imaging device may further include: a charge readout unit formed in the impurity region so as to contact with the barrier unit and having the first conductivity type; a charge transfer unit formed in the impurity region so as to contact with the charge readout unit and having the first conductivity type; and a readout electrode provided to the charge readout unit, wherein the barrier unit may be a charge hold unit configured as being capable of temporarily holding the charge transferred from the charge accumulation unit, depending on level of signal input to the readout electrode. Here, the surficial portion of the semiconductor substrate may have the first conductivity type, over a region having the charge accumulation unit, the barrier unit, the charge readout unit and the charge transfer unit formed therein.

According to the present invention, there is provided also a method of driving a solid-state imaging device including a semiconductor substrate; a first-conductivity-type impurity region provided in the surficial portion of the semiconductor substrate; a photo-electric conversion unit formed in the impurity region; a charge accumulation unit formed in the impurity region so as to contact with the photo-electric conversion unit, and temporarily accumulating charge generated in the photo-electric conversion unit, the charge accumulation unit having the first conductivity; a barrier unit formed in the impurity region so as to contact with the charge accumulation unit, and having the charge accumulation unit accumulate the charge, the barrier unit having the first conductivity; and a first electrode provided to the charge accumulation unit, including:

accumulating a charge in the charge accumulation unit, upon input of a high-level signal to the first electrode; and transferring the charge accumulated in the charge accumulation unit to the barrier unit, upon input of a low-level signal to the first electrode.

In this configuration, the charge is accumulated in the charge accumulation unit while deepening the potential of the charge accumulation unit relative to that of the photo-electric conversion unit, so that the charge generated in the photo-electric conversion unit can efficiently be transferred to the charge accumulation unit. This configuration can successfully reduce after-image of the photo-electric conversion unit.

According to the present invention, there is also provided a method of driving a solid-state imaging device including a semiconductor substrate; a first-conductivity-type impurity region provided in the surficial portion of the semiconductor substrate; a photo-electric conversion unit formed in the impurity region; a charge accumulation unit formed in the impurity region so as to contact with the photo-electric conversion unit, and temporarily accumulating charge generated in the photo-electric conversion unit, the charge accumulation unit having the first conductivity; a barrier unit formed in the impurity region so as to contact with the charge accumulation unit, and having the charge accumulation unit accumulate the charge, the barrier unit having the first conductivity; a first electrode provided to the charge accumulation unit; and a second electrode provided to the barrier unit, including:

accumulation a charge in the charge accumulation unit, upon input of a high-level signal to the first electrode, and input of a low-level signal to the second electrode; and transferring the charge accumulated in the charge accumulation unit to the barrier unit, upon input of a low-level signal to the first electrode, and input of a high-level signal to the second electrode.

It is to be understood that any arbitrary combinations of the above-described constituents, and any expressions in this patent specification present invention exchanged between "method" and "device" are also valid as embodiments of the present invention.

This invention can successfully control accumulation and transfer of charge at low voltages.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
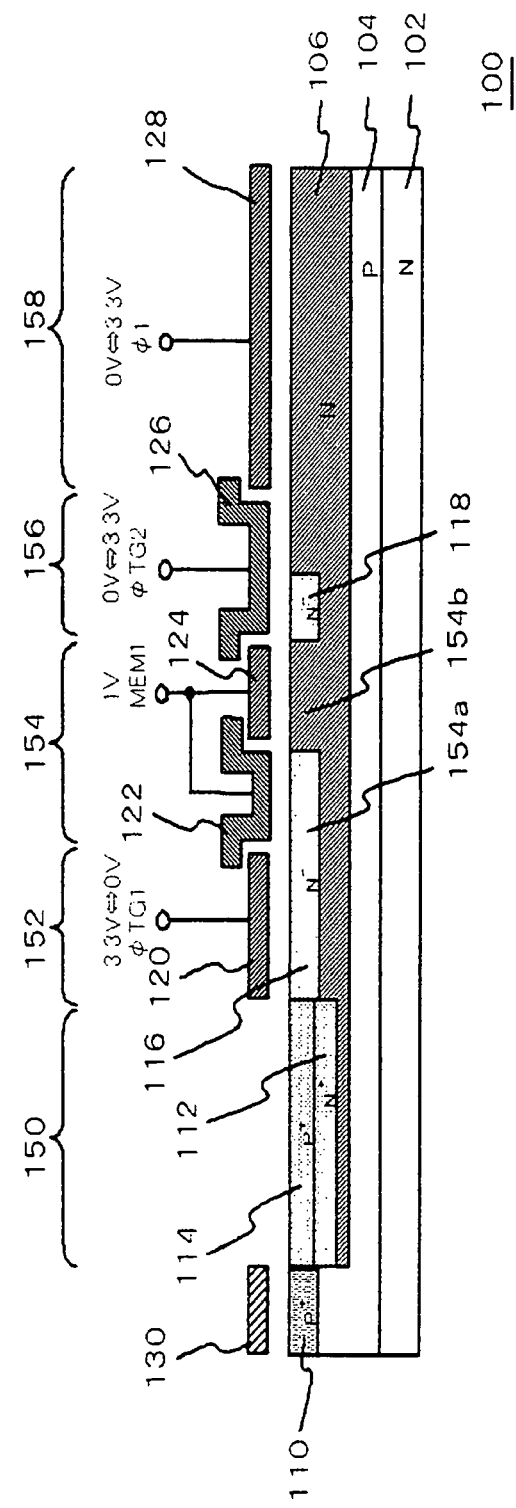
FIG. 1 is a sectional view showing a configuration of a solid-state imaging device according to an embodiment of the present invention.

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will describe embodiments of the present invention, referring to the attached drawings. It is to be noted that any similar constituents will be given with the similar reference numerals, and the explanation will not be repeated. The embodiments below deal with cases where the first conductivity type is N-type.

First Embodiment

A solid-state imaging device 100 of this embodiment is applicable to a contact sensor such as CIS (contact image sensor) used typically in scanner and MFP (multi-function peripheral).

The solid-state imaging device 100 includes a photo-electric conversion unit 150, a charge accumulation unit 152 temporarily accumulating charge generated in the photo-electric conversion unit 150, a charge hold region 154 (barrier unit) temporarily holding the charge transferred from the charge accumulation unit 152, a charge readout unit 156, and a charge transfer unit 158.

The solid-state imaging device 100 further includes an N-type semiconductor substrate 102, a P-well 104 formed in the N-type semiconductor substrate 102, and an N-type impurity region 106 formed in the surficial portion of the P-well 104. In this embodiment, the photo-electric conversion unit 150, the charge accumulation unit 152, the charge hold region 154, the charge readout unit 156 and the charge transfer unit 158 are formed in the N-type impurity region 106. All of the charge accumulation unit 152, the charge hold region 154, the charge readout unit 156 and the charge transfer unit 158 are composed of N-type impurity layers. In addition, all of the surficial portions of the charge accumulation unit 152, the charge hold region 154, the charge readout unit 156 and the charge transfer unit 158 are composed of N-type impurity layers.

The photo-electric conversion unit 150 includes a first N-type impurity layer 112 and a second P-type impurity layer 114 formed thereon, both formed in the N-type impurity region 106. The first N-type impurity layer 112 is an $N^+$-type, impurity-diffused region having a carrier concentration higher that that of the N-type impurity region 106. A first P-type impurity layer 110 is a $P^+$-type, impurity-diffused region having a carrier concentration higher than that of the P-well 104. By forming the second P-type impurity layer 114 on the first N-type impurity layer 112 as shown in the above, leakage current ascribable to levels at the silicon-oxide film interface in the photo-electric conversion unit 150 can be prevented from flowing into the first N-type impurity layer 112.

The solid-state imaging device 100 includes a second N-type impurity layer 116 formed in the N-type impurity region 106 so as to contact with the photo-electric conversion unit 150. In this embodiment, the charge accumulation unit 152 is composed of a part of the second N-type impurity layer 116. The second N-type impurity layer 116 is an $N^-$-type, impurity-diffused region having a carrier concentration lower than that of the N-type impurity region 106.

In this embodiment, the photo-electric conversion unit 150 and the charge accumulation unit 152 are formed in the N-type impurity region 106. The second N-type impurity layer 116 having the same conductivity type with the first N-type impurity layer 112 is formed in contact with the photo-electric conversion unit 150. The charge generated in the photo-electric conversion unit 150 can therefore be transferred through the buried channel to the charge accumulation unit 152 under low voltages. It is, therefore, made possible to reduce, or almost completely remove the after-image in the photo-electric conversion unit 150 under low voltages.

The solid-state imaging device 100 includes a third N-type impurity layer 118 formed in the N-type impurity region 106, as being apart from the second N-type impurity layer 116. In this embodiment, the charge hold region 154 is composed of the residual portion of the second N-type impurity layer 116 and a region (N-type impurity region 106) which falls between the second N-type impurity layer 116 and the third N-type impurity layer 118. In other words, the charge hold region 154 is composed of a first region 154a (second N-type impurity layer 116) provided in contact with the charge accumulation unit 152, and a second region 154b (N-type impurity region 106) having a potential deeper than that of the second N-type impurity layer 116. This configuration can transfer the charge, having been transferred into the charge hold region 154, in the direction towards the charge transfer unit 158.

The third N-type impurity layer 118 is formed so as to configure a part of the charge readout unit 156. In this embodiment, the charge readout unit 156 is composed of the third N-type impurity layer 118 and a part of the N-type impurity region 106. The third N-type impurity layer 118 is an $N^-$-type, impurity-diffused region having a carrier concentration lower than that of the N-type impurity region 106. The third N-type impurity layer 118 of the charge readout unit 156 has a potential shallower than that of the second region 154b of the charge hold region 154. The charge can, therefore, be held in the charge hold region 154, or read out from the charge hold region 154, by adjusting the level of signal to be input to a charge readout electrode 126, the explanation to which will be described in the following.

The charge transfer unit 158 is composed of a part of the N-type impurity region 106.

The solid-state imaging device 100 includes the first P-type impurity layer 110 formed in the P-well 104 so as to contact with the photo-electric conversion unit 150, and an electrode 130 formed thereon. The P-type impurity layer 110 functions as a channel-stop region.

The solid-state imaging device 100 further includes a charge accumulating electrode 120 (first electrode) provided to the charge accumulation unit 152, a first charge holding electrode 122 (second electrode) and a second charge holding electrode 124 (second electrode) provided to the charge hold region 154, a charge readout electrode 126 (third electrode) provided to the charge readout unit 156, and a charge transferring electrode 128 provided to the charge transfer unit 158. Although the charge accumulating electrode 120 and the first charge holding electrode 122 here are configured as being separated from each other, they may be formed in an integrated manner. Although not shown, a gate insulating film is formed between each of the individual electrodes and the surface of the semiconductor substrate.

In this embodiment, the charge accumulating electrode 120 is supplied with a first clock signal φTG1. The first clock signal φTG1 has a high level of 3.3 V, and a low level of 0 V. The charge readout electrode 126 is supplied with a second clock signal φTG2. The second clock signal φTG2 has a high level of 3.3 V, and a low level of 0 V. The charge transferring electrode 128 is supplied with a third clock signal φ1. The third clock signal φ1 has a high level of 3.3 V, and a low level of 0 V.

In this embodiment, the charge accumulation unit 152 is configured as being switchable between a first state allowing accumulation of the charge upon input, to the charge accumulating electrode 120, of a signal having a level higher than that of a signal input to the first charge holding electrode 122 (and second charge holding electrode 124), and a second state allowing transfer of the charge accumulated upon input, to charge accumulating electrode 120, of a signal having a level lower than that of a signal input to the first charge holding electrode 122 (and second charge holding electrode 124). In this embodiment, the solid-state imaging device 100 is driven by accumulating the charge in the charge accumulation unit 152, upon input of a high-level first clock signal φTG1 to the charge accumulating electrode 120; and transferring the charge accumulated in the charge accumulation unit 152 to the charge hold region 154, upon input of a low-level first clock signal φTG1 to the charge accumulating electrode 120. In the process steps of accumulating and transferring the charge, a constant potential between signal values of the high-level signal and the low-level signal to be input to the charge accumulating electrode 120, may be provided to the first charge holding electrode 122 and the second charge holding electrode 124. The first charge holding electrode 122 and the second charge holding electrode 124 are electrically connected, allowing input of a constant potential signal MEM1. The constant potential signal MEM1 may be 1 V.

In this embodiment, the first region 154a of the charge hold region 154 and the charge accumulation unit 152 are composed of a second N-type impurity layer 116, and have substantially the same impurity concentration (carrier concentration). This configuration substantially equalizes the potential of the charge accumulating electrode 120 and the first charge holding electrode 122 under a state having no signal input. Relative potential depth between the charge accumulation unit 152 and the charge hold region 154, is therefore switchable without considerably expanding the difference in the level of signals to be input to the charge accumulating electrode 120. Assuming now that the potential difference between the high level and low level of the first clock signal φTG1 to be input to the charge accumulating electrode 120 is only as large as 3 V or around, this configuration allows accumulation of the charge into the charge accumulation unit 152 and readout of the charge from the charge accumulation unit 152 in a well-controlled manner.

Figure 2:
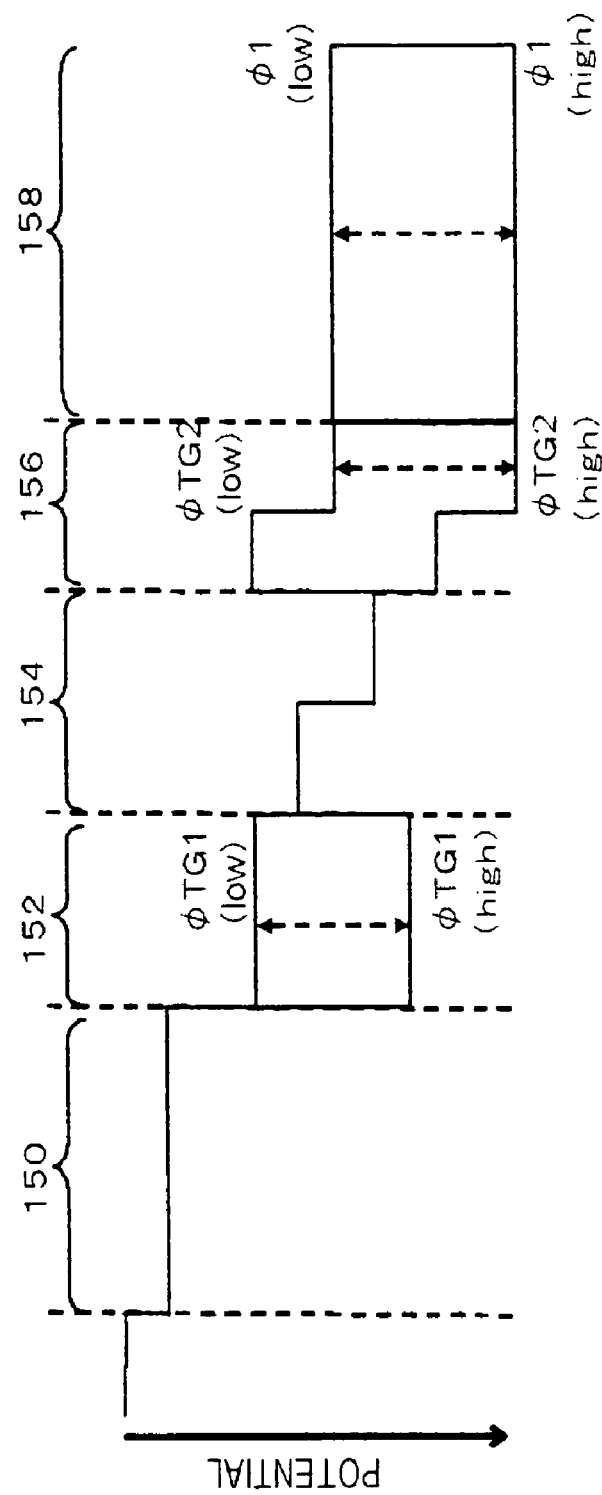
FIG. 2 is a potential chart of the solid-state imaging device according to the embodiment of the present invention.

FIG. 2 is a potential chart of thus-configured solid-state imaging device 100. In this drawing, the downward direction indicates lower (deeper) potential. The charge migrates towards the lower potential side. In this embodiment, the charge accumulation unit 152 is configured as being switchable in the depth (height) of potential relative to that of the charge hold region 154, based on the signal input to the charge accumulating electrode 120.

To accumulate the charge into the charge accumulation unit 152, the first clock signal φTG1 to be input to the charge accumulating electrode 120 is brought up to the high level (3.3 V). The constant potential signal MEM1 (1 V) is input to the first charge holding electrode 122 and the second charge holding electrode 124. The charge accumulating electrode 120 in this case is, therefore, applied with a voltage higher than that applied to the first charge holding electrode 122, so that the potential of the charge accumulation unit 152 becomes deeper than the potential of the charge hold region 154. As a consequence, the charge is accumulated in the charge accumulation unit 152.

Next, the first clock signal φTG1 to be input to the charge accumulating electrode 120 is brought down to the low level (0 V), and the second clock signal φTG2 to be input to the charge readout electrode 126 is also brought down to the low level (0 V). The first charge holding electrode 122 and the second charge holding electrode 124 are remained as being applied with the 1-V constant potential signal MEM1. The charge accumulating electrode 120 in this case is, therefore, applied with a voltage lower than that applied to the first charge holding electrode 122, so that the potential of the charge accumulation unit 152 becomes shallower than the potential of the charge hold region 154. Also the potential of the charge readout unit 156 becomes shallower than the potential of the charge hold region 154. As a consequence, the charge accumulated in the charge accumulation unit 152 is transferred to the charge hold region 154 and held therein.

Then, the second clock signal φTG2 to be input to the charge readout electrode 126 and the third clock signal φ1 to be input to the charge transferring electrode 128 are brought up to the high level (3.3 V). By this operation, the charge held in the charge hold region 154 is transferred to the charge readout unit 156, and then transferred to the charge transfer unit 158 upon bringing the second clock signal φTG2 down to the low level (0 V).

The solid-state imaging device 100 of this embodiment is configured so as to deepen the potential of the charge accumulation unit 152, when the charge is accumulated into the charge accumulation unit 152. Therefore, the device can efficiently transfer the charge generated in the photo-electric conversion unit 150 to the charge accumulation unit 152, and accumulate it therein. As a consequence, after-image of the photo-electric conversion unit 150 can be reduced, or can almost completely be eliminated.

Paragraphs below will explain procedures of fabricating the solid-state imaging device 100 configured as shown in FIG. 1.

First, boron is implanted (for example, with a dose of $1.0 \times 10^{12}$ to $5.0 \times 10^{12}$ cm$^{-2}$) in the surficial portion of the N-type semiconductor substrate 102, to thereby selectively form the P-well 104. Phosphorus is then implanted (for example, with a dose of $1.0 \times 10^{12}$ to $5.0 \times 10^{12}$ cm$^{-2}$) into a region destined for the photo-electric conversion unit 150, the charge accumulation unit 152, the charge hold region 154, the charge readout unit 156 and the charge transfer unit 150, to thereby form the N-type impurity region 106. Boron is then implanted (for example, with a dose of $1.0 \times 10^{13}$ to $5.0 \times 10^{13}$ cm$^{-2}$) into the N-type impurity region 106, to thereby form the first P-type impurity layer 110 in adjacent to the region destined for the photo-electric conversion unit 150.

Boron is then implanted (for example, with a dose of $1.0 \times 10^{11}$ to $1.0 \times 10^{12}$ cm$^{-2}$) into the region destined for the photo-electric conversion unit 150 and the charge accumulation unit 152, and into a part of the region destined for the charge hold region 154, to thereby form the N$^-$-type impurity layer. The second N-type impurity layer 116 is formed in this way.

Next, the gate insulating film (not shown) is formed over the entire surface of the N-type semiconductor substrate 102. A first electrode layer is then formed over the entire surface of the gate insulating film, typically by the CVD process. Thereafter, the first electrode layer is selectively etched off on the photo-electric conversion unit 150. Next, phosphorus (for example, with a dose of $1.0 \times 10^{12}$ to $5.0 \times 10^{12}$ cm$^{-2}$) and boron (for example, with a dose of $1.0 \times 10^{13}$ to $5.0 \times 10^{13}$ cm$^{-2}$) are implanted into the photo-electric conversion unit 150 using the first electrode layer as a mask, to thereby form the first N-type impurity layer 112 and the second P-type impurity layer 114, respectively. The second N-type impurity layer 116 herein can be configured as achieving a potential deeper than that of the photo-electric conversion unit 150, upon input of whichever one of the first clock signals φTG1 of high level and low level, to the charge accumulating electrode 120.

Next, the first electrode layer 9 is patterned by etching to obtain a predetermined geometry, to thereby form the electrodes 120, 124, 128 and 130. Thereafter boron is implanted (for example, with a dose of $1.0 \times 10^{11}$ to $1.0 \times 10^{12}$ cm$^{-2}$) into the charge readout unit 156 using a mask opened on a part of the charge readout unit 156, to thereby form the third N-type impurity layer 118.

Thereafter, the exposed portion of the gate insulating film is removed, to thereby form a second gate insulating film. Next, a second electrode layer is formed typically by the CVD process. The second electrode layer is then patterned by etching to obtain a predetermined geometry. Thereafter, an interlayer insulating film is formed over the entire surface of the N-type semiconductor substrate 102. Next, contact holes for making contact therethrough with the individual electrodes are formed in the interlayer insulating film, and the solid-state imaging device 100 is completed by filling the contact holes with a metal interconnection (not shown). In addition, the region other than the photo-electric conversion unit 150 of the solid-state imaging device 100 is covered with a shield film, not shown.

As has been described in the above, in the solid-state imaging device 100 of this embodiment, the charge generated in the photo-electric conversion unit 150 is transferred through the buried channel formed in the N-type impurity region 106. It is therefore made possible to control accumulation, holding and transfer of the charge under low voltages, without need of forming a surface channel.

Figure 3:
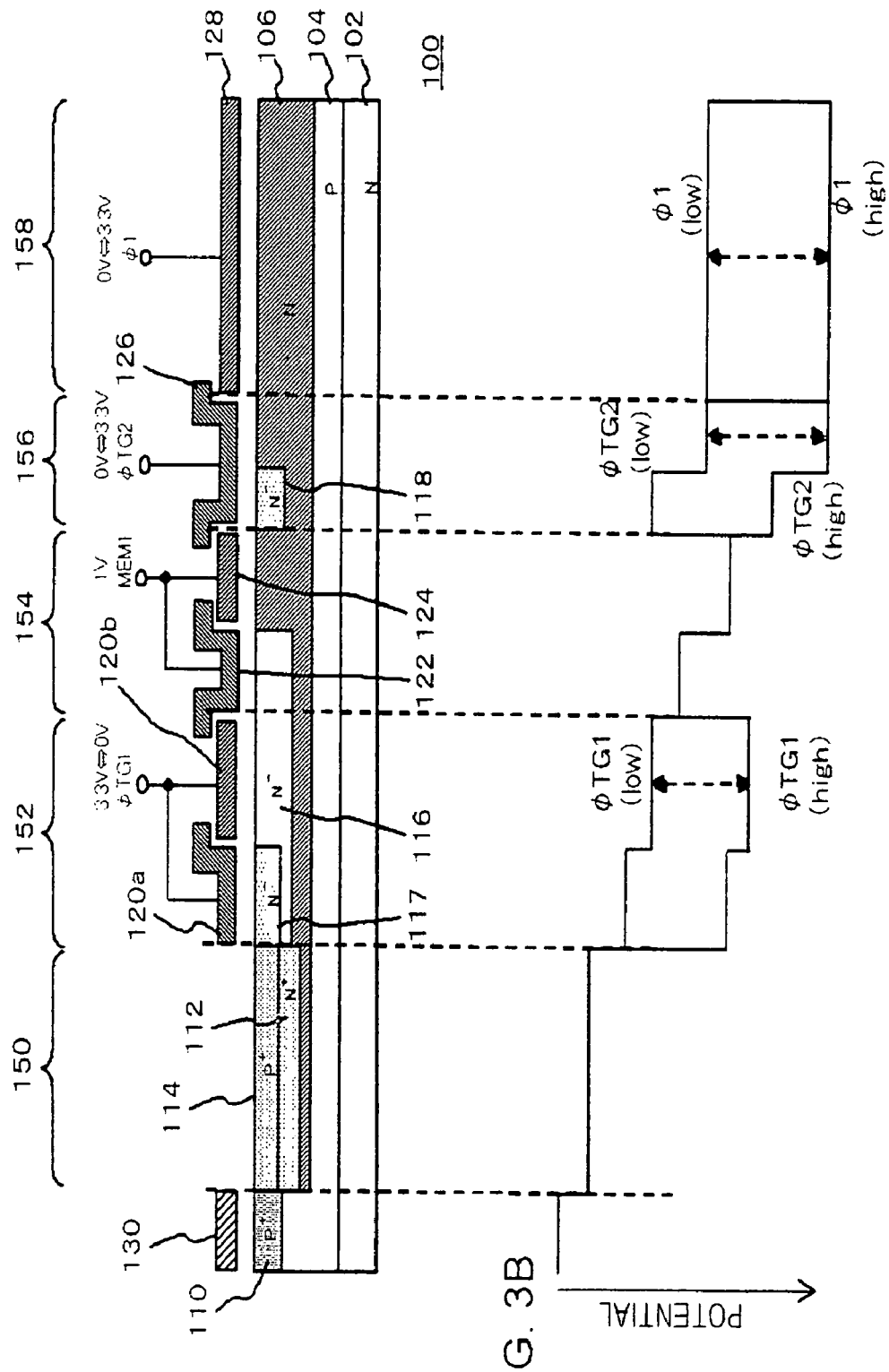
FIGS. 3A and 3B are sectional view and potential chart, respectively, of another solid-state imaging device according to the embodiment of the present invention.

FIGS. 3A and 3B are drawings showing another example of the solid-state imaging device 100 of this embodiment. FIG. 3A is a sectional view of the solid-state imaging device 100, and FIG. 3B shows a potential chart of the solid-state imaging device 100 shown in FIG. 3A.

This example differs from the solid-state imaging device 100 shown in FIG. 1, in the configuration of the charge accumulation unit 152. As shown in FIG. 3A, the charge accumulation unit 152 herein further includes a fourth N-type impurity layer 117 provided in contact with the photo-electric conversion unit 150. In the charge accumulation unit 152, a first charge accumulating electrode 120a is provided on the fourth N-type impurity layer 117, and a second charge accumulating electrode 120b is provided on the other region. The first charge accumulating electrode 120a and the second charge accumulating electrode 120b are electrically connected with each other, to which the first clock signal φTG1 is input. The first charge accumulating electrode 120a and the second charge accumulating electrode 120b configured as being separated herein may be formed in an integrated manner. The fourth N-type impurity layer 117 is an N⁻-type impurity layer having a carrier concentration lower than those of the N-type impurity region 106 and the second N-type impurity layer 116.

As shown in FIG. 3B, the fourth N-type impurity layer 117 has a potential shallower than that of the second N-type impurity layer 116. The charge accumulation unit 152 can therefore be given as having a potential difference. This contributes to smooth migration of the charge towards the charge transfer unit 158. Also in this case, accumulation, holding and transfer of the charge can be controlled under low voltages, similarly to as in the configuration shown in FIG. 1.

Figure 4:
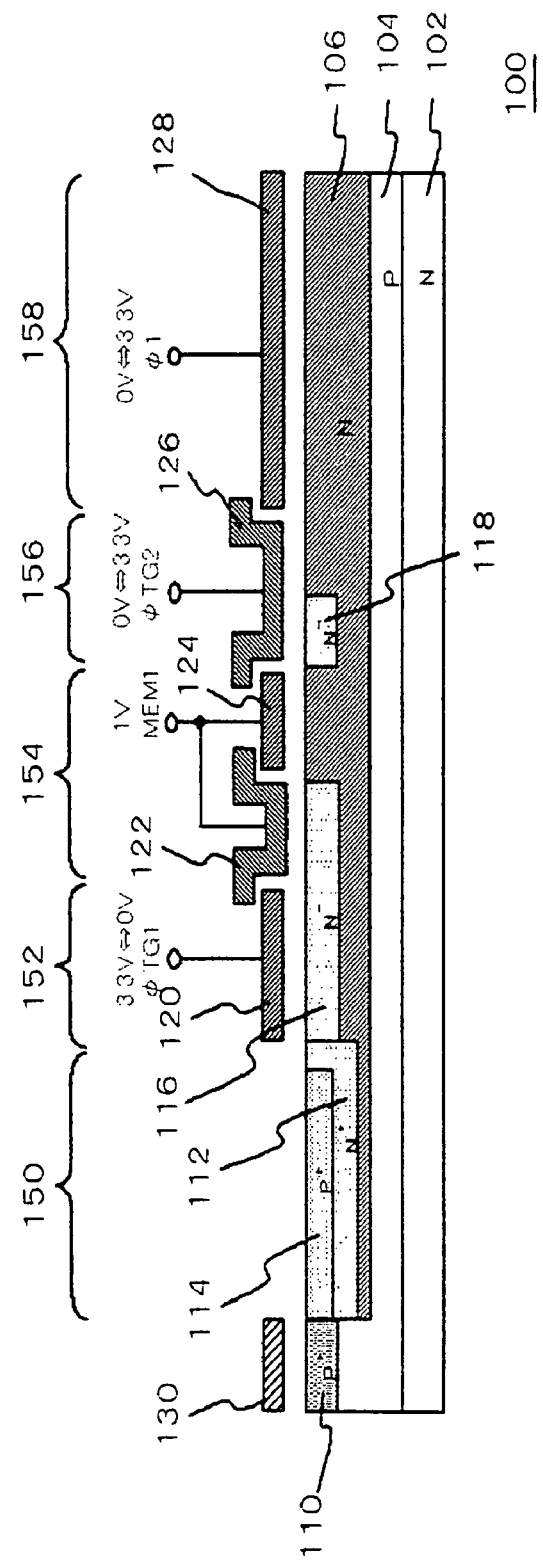
FIG. 4 is a sectional view showing a configuration of still another solid-state imaging device according to the embodiment of the present invention.

FIG. 4 is a sectional view showing still another example of the solid-state imaging device 100 of this embodiment.

This example differs from the solid-state imaging device 100 shown in FIG. 1 in the configuration of the photo-electric conversion unit 150. The photo-electric conversion unit 150 herein is configured so that the first N-type impurity layer 112 exposes to the surface of the N-type semiconductor substrate 102 in a region in contact with the charge accumulation unit 152. This contributes to smooth transfer of the charge accumulated in the photo-electric conversion unit 150. Also in this case, accumulation, holding and transfer of the charge can be controlled under low voltages, similarly to as in the configuration shown in FIG. 1.

Second Embodiment

Figure 5:
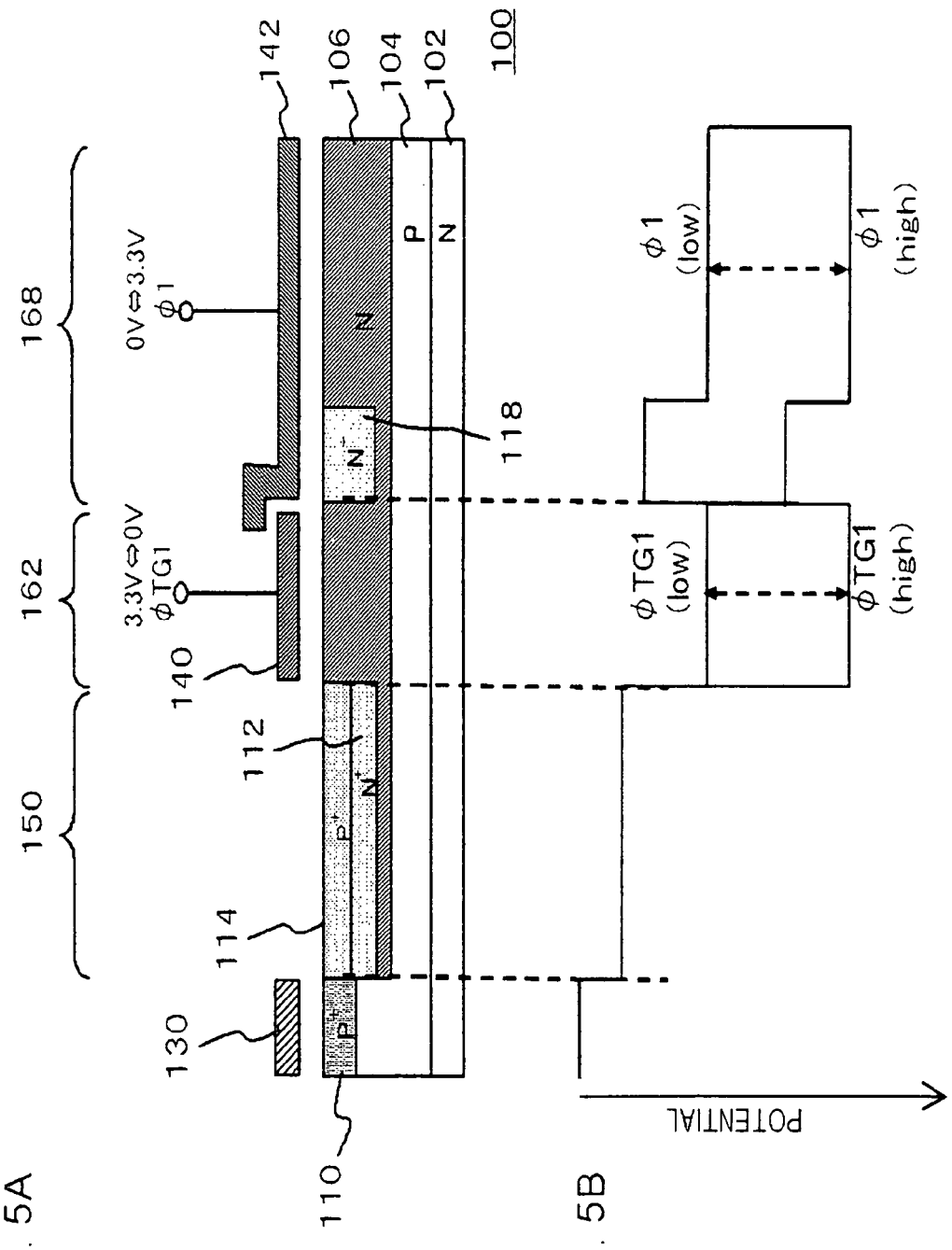
FIGS. 5A and 5B are sectional view and potential chart, respectively, of a solid-state imaging device according to another embodiment of the present invention.
Figure 6:
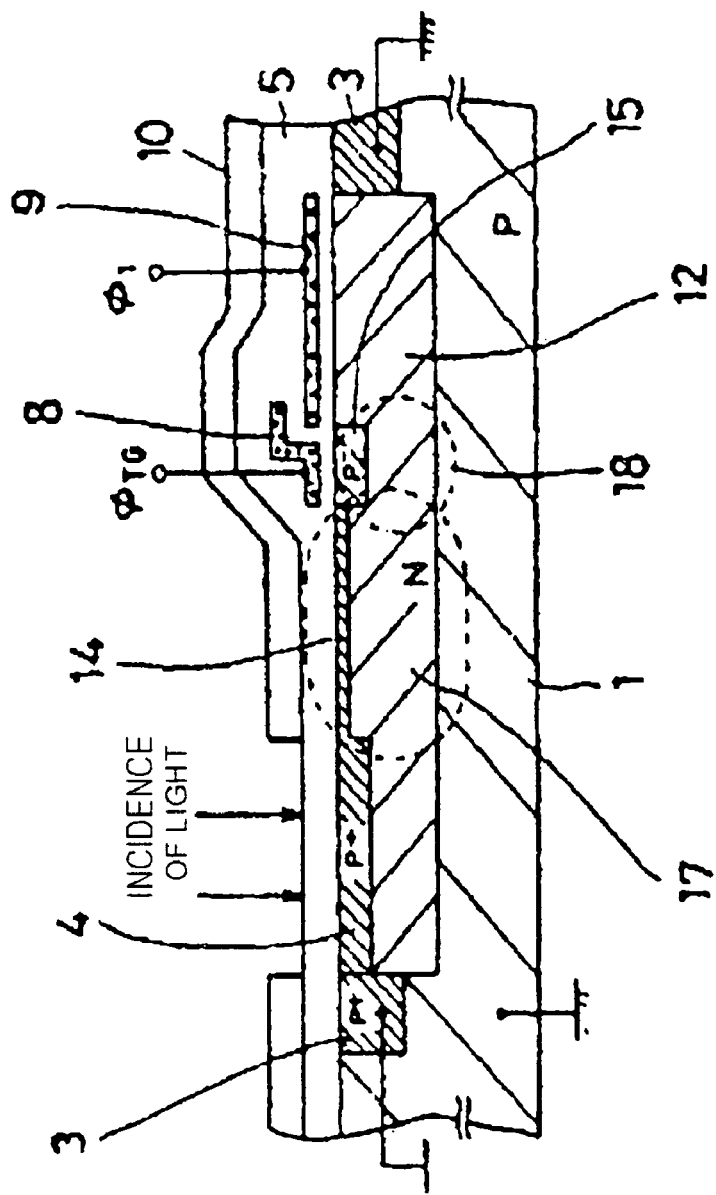
FIG. 6 is a sectional view showing a configuration of a conventional solid-state imaging device.
Figure 7:
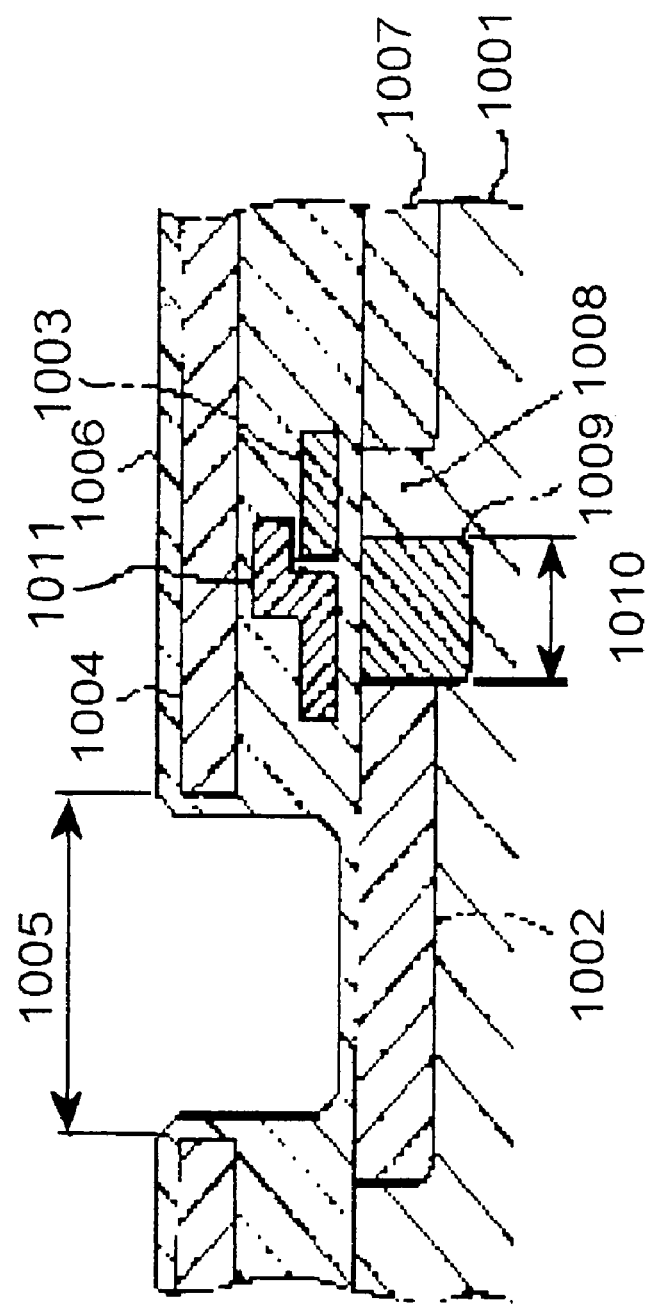
FIG. 7 is a sectional view showing a configuration of another conventional solid-state imaging device.

FIGS. 5A and 5B are sectional view and potential chart, respectively, of a solid-state imaging device of this embodiment.

The solid-state imaging device 100 of this embodiment differs from the solid-state imaging device 100 of the first embodiment, in having no charge hold region 154 and no charge readout unit 156.

FIG. 5A shows a sectional view of the solid-state imaging device 100 of this embodiment. The solid-state imaging device 100 includes the photo-electric conversion unit 150, a charge accumulation unit 162 provided in adjacent to the photo-electric conversion unit 150, and a charge transfer unit 168 (barrier unit) provided in adjacent to the charge accumulation unit 162. The charge accumulation unit 162 is provided with a charge accumulating electrode 140, and the charge transfer unit 168 is provided with a charge transferring electrode 142.

Also in this embodiment, the solid-state imaging device 100 includes the N-type semiconductor substrate 102, the P-well 104 formed in the N-type semiconductor substrate 102, and the N-type impurity region 106 formed in the surficial portion of the P-well 104. In this embodiment, the photo-electric conversion unit 150, the charge accumulation unit 162 and the charge transfer unit 168 are formed in the N-type impurity region 106. All of the charge accumulation unit 162 and the charge transfer unit 168 are configured by the N-type impurity layers. In addition, the surficial portions of the charge accumulation unit 162 and the charge transfer unit 168 are totally configured by the N-type impurity layers.

The charge transfer unit 168 is configured by the third N-type impurity layer 118 formed in the N-type impurity region 106 and a part of the N-type impurity region 106. The third N-type impurity layer 11.8 is an N-type, impurity-diffused region having a carrier concentration lower than that of the N-type impurity region 106. The charge accumulation unit 162 is configured by a portion of the N-type impurity region 106 fallen between the photo-electric conversion unit 150 and the third N-type impurity layer 118.

In this embodiment, the charge accumulating electrode 140 is supplied with the first clock signal φTG1. The first clock signal φTG1 has a high level of 3.3 V, and a low level of 0 V. The charge transferring electrode 142 is supplied with the third clock signal φ1. The third clock signal φ1 has a high level of 3.3 V, and a low level of 0 V.

In this embodiment, the solid-state imaging device 100 can be driven by accumulating the charge in the charge accumulation unit 162, upon input of the high-level signal to the charge accumulating electrode 140, and upon input of the low-level signal to the charge transferring electrode 142; and transferring the charge accumulated in the charge accumulation unit 162 to the charge transfer unit 168, upon input of the low-level signal to the charge accumulating electrode 140, and upon input of the high-level signal to the charge transferring electrode 142.

FIG. 5B is a potential chart of the solid-state imaging device 100 shown in FIG. 5A.

In this embodiment, the charge accumulation unit 162 and the charge transfer unit 168 are configured as being switchable in their relative depths of potential, based on signals respectively input to the charge accumulating electrode 140 and the charge transferring electrode 142.

To accumulate the charge into the charge accumulation unit 162, the first clock signal φTG1 to be input to the charge accumulating electrode 140 is brought up to the high level (3.3 V). As a consequence, the charge is accumulated in the charge accumulation unit 162. The charge transferring electrode 142 herein is supplied with a pulsive third clock signal φ1 having the high level and the low level alternately repeated therein. In this embodiment, the charge transfer unit 168 is provided with the third N-type impurity layer 118, wherein the potential of the third N-type impurity layer 118 of the charge transfer unit 168 remained shallow than the potential of the charge accumulation unit 162, even when the high-level signal is input to the charge transferring electrode 142. The charge is therefore accumulated in the charge accumulation unit 162, so far as input of the high-level first clock signal φTG1 into the charge accumulating electrode 140 continues.

Next, the first clock signal φTG1 to be input to the accumulating electrode 140 is brought down to the low level (0 V). The potential of the charge accumulation unit 162 then becomes shallow, When the charge transferring electrode 142 herein is applied with the third clock signal φ1 of high level, the potential of the charge transfer unit 168 becomes deeper than the potential of the charge accumulation unit 162. As a consequence, the charge accumulated in the charge accumulation unit 162 is transferred to the charge transfer unit 168.

Also in the solid-state imaging device 100 of this embodiment, accumulation and transfer of the charge can be controlled under low voltages, without need of forming a surface channel.

The present invention has been described in the foregoing paragraphs referring to the embodiments and examples. These embodiments and examples are of only exemplary purposes, so that it is readily understood by those skilled in the art that any modifications will be allowable and that such modification are also within the scope of the present invention.

The constant potential, explained in the first embodiment as being input to the first charge holding electrode 122 and the second charge holding electrode 124, can be controlled.

The embodiments described in the above have shown the configuration having the P-well 104 provided to the N-type semiconductor substrate 102, whereas it is also allowable to use a P-type semiconductor substrate, and to provide therein the N-type impurity region. The first conductivity type, explained as being N-type in the above-described embodiments, may be inverted.

It is apparent that the present invention is not limited to the above embodiment, that may be modified and changed without departing from the scope and spirit of the invention.

What is claimed is:

1. A solid-state imaging device comprising:
    a semiconductor substrate;
    a first impurity region having a first conductivity type provided in a surficial portion of the semiconductor substrate;
    a photo-electric conversion unit in the first impurity region;
    a charge accumulation unit in the first impurity region, in contact with the photo-electric conversion unit, and temporarily accumulating charge generated in the photo-electric conversion unit;
    a charge transfer unit in the first impurity region receiving the temporarily accumulating charge from the charge accumulation unit and transferring the temporarily accumulating charge;
    a second impurity region in the first impurity region, provided in a surficial portion of an area including the charge accumulation unit and the charge transfer unit, the second impurity region having the first conductivity type; and an electrode provided over the second impurity region, one of a high-level signal and a low-level signal being input to the electrode.

2. The solid-state imaging device as claimed in claim 1, wherein the second impurity region is provided in the charge accumulation unit, the electrode is configured as a charge accumulating electrode.

3. The solid-state imaging device as claimed in claim 2, wherein the second impurity region is in contact with the photo-electric conversion unit.

4. The solid-state imaging device as claimed in claim 3, wherein the charge accumulation unit further comprising: a fourth impurity region in the second impurity region, the second impurity region having a potential deeper than that of the fourth impurity region.

5. The solid-state imaging device as claimed in claim 4, wherein the fourth impurity region is in contact with the photo-electric conversion unit.

6. The solid-state imaging device as claimed in claim 5, wherein the fourth impurity region is provided in a part of the charge accumulation unit.

7. The solid-state imaging device as claimed in claim 6, wherein the charge accumulation unit includes the second impurity region provided between the fourth impurity region and the charge hold unit, the second impurity region having a potential deeper than that of the fourth impurity region.

8. The solid-state imaging device as claimed in claim 2, further comprising:
    a charge hold unit in the first impurity region, in contact with the charge accumulation unit; and a charge readout unit in the first impurity region, provided between the charge hold unit and the charge transfer unit.

9. The solid-state imaging device as claimed in claim 8, wherein the second impurity region is extended in the charge hold unit.

10. The solid-state imaging device as claimed in claim 9, wherein the second impurity region is provided in a part of the charge hold unit.

11. The solid-state imaging device as claimed in claim 10, wherein the charge hold unit includes the first impurity region provided between the second impurity region and the charge readout unit, the first impurity region having a potential deeper than that of the second impurity region.

12. The solid-state imaging device as claimed in claim 8, further comprising:
    a third impurity region in the first impurity region, provided in the charge readout unit.

13. The solid-state imaging device as claimed in claim 12, wherein the third impurity region is in contact with the charge hold unit.

14. The solid-state imaging device as claimed in claim 13, wherein the third impurity region is provided in a part of the charge readout unit.

15. The solid-state imaging device as claimed in claim 14, wherein the charge readout unit includes the first impurity region provided between the third impurity region and the charge transfer unit, the first impurity region having a potential deeper than that of the third impurity region.

16. The solid-state imaging device as claimed in claim 1, wherein the second impurity region is provided in a part of the charge transfer unit, the electrode is configured as a charge transferring electrode, the charge transfer unit includes the second impurity region in contact with the charge accumulation unit and the first impurity region, the first impurity region has a potential deeper than that of the second impurity region, and the charge transfer unit receives the temporarily accumulating charge from the charge accumulation unit through the second impurity region to the first impurity region and transfers the temporarily accumulating charge through the first impurity region.

* * * * *